United States Patent [19]
Feng et al.

[11] 4,360,702
[45] Nov. 23, 1982

[54] COPPER OXIDE/N-SILICON HETEROJUNCTION PHOTOVOLTAIC DEVICE

[75] Inventors: Tom Feng, Morris Plains; Amal K. Ghosh, New Providence, both of N.J.

[73] Assignee: Exxon Research and Engineering Co., Florham Park, N.J.

[21] Appl. No.: 222,368

[22] Filed: Jan. 5, 1981

[51] Int. Cl.³ .................. H01L 31/06; H01L 31/18
[52] U.S. Cl. ............................. 136/261; 29/572; 136/265; 357/30; 427/74
[58] Field of Search ............... 136/261, 265; 357/30; 427/74; 29/572

[56] References Cited
U.S. PATENT DOCUMENTS
2,537,256  1/1951  Brattain .................. 136/261

OTHER PUBLICATIONS
V. F. Drobny et al., "The Photovoltaic Properties of Thin Copper Oxide Films", *Conf. Record, 13th IEEE Photovoltaic Specialists Conf.*" (1978), pp. 180–183.

*Primary Examiner*—Aaron Weisstuch
*Attorney, Agent, or Firm*—Paul E. Purwin; Robert S. Salzman

[57] ABSTRACT

A photovoltaic device having characteristics of a high efficiency solar cell comprising a $Cu_xO$/n-Si heterojunction. The $Cu_xO$ layer is formed by heating a deposited copper layer in an oxygen containing ambient.

12 Claims, 1 Drawing Figure

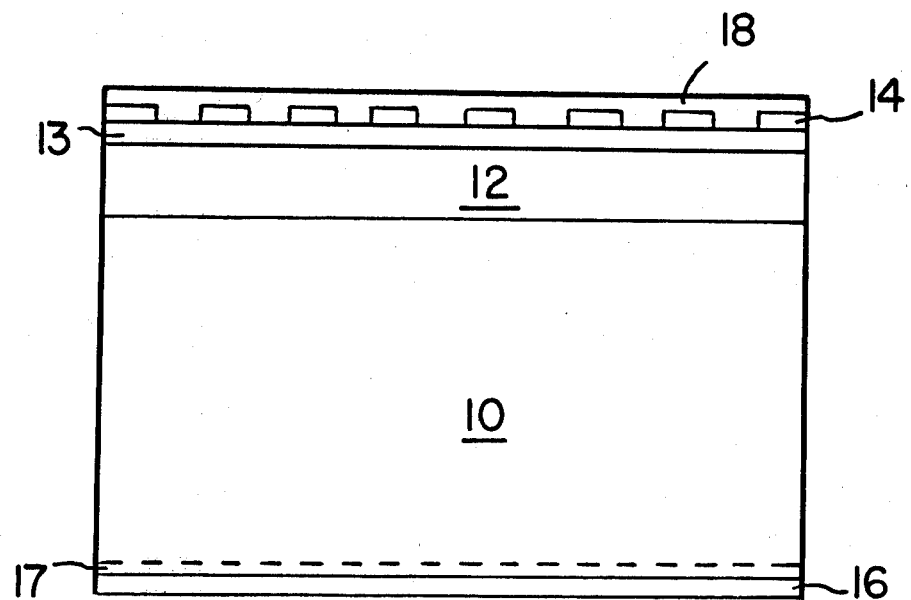

COPPER OXIDE/N-SILICON HETEROJUNCTION PHOTOVOLTAIC DEVICE

BACKGROUND OF THE INVENTION

The present invention is the result of research performed for the Department of Energy under U.S. Government Contract DE-AC03-79ET23047.

FIELD OF THE INVENTION

The invention relates to photoconductive devices and in particular to a copper oxide n-Silicon photovoltaic device.

The semiconductor properties of copper oxide have been studied as early as 1920. Research emphasis had been toward copper, copper oxide rectifiers and more recently $Cu_2O/Cu$ solar cells. Prior effects with such $Cu_2O/Cu$ cells have met with limited success. In contrast, the present invention results from the adoption of a new approach, forming a photovoltaic heterojunction between silicon and copper oxide.

The term copper oxide is herein used in the generic sense, being meant to include cuprous oxide, cupric oxide and mixtures thereof. Attempts have been made to integrate the well developed silicon technology with the relatively undeveloped semiconductor technology of copper oxide. An early effort by W. Brattain in U.S. Pat. No. 2,537,257 attempted to form photocells by depositing a layer of silicon (or silicon dioxide) onto oxidized copper.

In contrast, the present invention teaches a silicon copper oxide photovoltaic device capable of achieving a substantially high conversion efficiency.

Present silicon solar cell technology generally requires high temperature (greater than 1000° C.) junction forming processing. The process is energy intensive, and accordingly expensive. The diffusion gases used to form the junctions are toxic. The high temperature processing increases the material purity requirements. All these factors add to the complexity and cost of producing solar cells according to these conventional techniques, inhibiting solar cell technology from effectively competing as an alternate energy source. The device of the present invention avoids these requirements and promises a substantial cost reduction in the production of solar cells.

SUMMARY OF THE INVENTION

A photovoltaic device having characteristics of a high efficiency solar cell comprises a $Cu_xO/n$-Si heterojunction. The $Cu_xO$ layer is formed by heating a deposited copper layer in an oxygen containing ambient.

BRIEF DESCRIPTION OF THE DRAWING

The single FIGURE in the case is a segmented sideview, greatly enlarged of an exemplary photovoltaic device constructed in accordance with the teaching of the present invention.

DETAILED DESCRIPTION OF THE INVENTION

Referring to the drawing, a silicon substrate 10 serves both as a junction forming semiconductor and as a physical support for thin film layer deposited thereon. The n-type silicon comprises an n-type wafer of single crystal silicon having a thickness ranging from about 5 to about 20 mils or polycrystalline silicon cut to a thickness of about 5 mils to about 20 mils. The resistivity of the silicon should be in the range of about 0.05 to 10 ohm-cm. The surface of the silicon substrate 10 is coated with a layer of copper 12. The thickness of copper layer 12 ranges from about 30 to about 2000 angstroms depending upon the sheet resistance and the optical transmission characteristics of the copper oxide film generally characterize the optical thickness sheet resistance of transmission properties. Numerous techniques are known in the art for depositing copper layer 12, including vacuum-deposition and electro-plating methods. In one embodiment a 500 Å layer of copper is vacuum deposited by thermal evaporation onto a single crystal n-type silicon wafer.

The copper layer 13 is converted to copper oxide ($Cu_xO$) by heating of the substrate 10 and the overlying copper layer 12 in an oxidizing ambient. The $Cu_xO$ is p-type, forming a P-N heterojunction to the contiguous n-type silicon. A temperature range of about 200° C. to about 400° C. is operative to oxidize the copper layer $Cu_xO$. The relatively low processing temperature used to form a heterojunction is an advantage both in the economics of manufacturing such cells and of equal importance, the lowered processing temperature is a technical advantage in minimizing preferential diffusion of detrimental impurities into the silicon substrate. Such preferential diffusion is a possible cause of deterioration of the basic electrical parameters of a solar cell. The advantage afforded the present invention is of special importance when silicon substrate 10 comprises polycrystalline silicon whereby the relatively low processing temperature minimizes preferential diffusion along the polycrystalline grain boundaries, a long standing impediment to the use of this lower cost material in efficient solar cells. Depending upon the thickness of layer 12 and heat treatment temperature, the heating continues for a time period ranging from about 1 sec. to about 600 sec. During the heat treatment the copper layer initially having a metallic appearance, is oxidized to taking on a physical appearance of deep blue in color. The resultant $Cu_xO$ layer is of sufficient thickness to avoid pin holes through the oxide which manifests as electrical shorting paths in the completed device. This thickness criteria is balanced, however, with a need to provide a sufficiently thin oxide layer to assure that incident light energy reaches the active region of the device.

In certain embodiments, the junction forming oxide layer 12 is not sufficiently conductive to alone serve as an current carrying electrode. Accordingly, a grid 14 is deposited onto oxide layer 12. The grid 14 comprises a highly conductive material, typically metallic, and functions to collect current generated by the heterojunction. Grid 14 is fashioned to maximize the exposed surface area of oxide 12, yet minimize the resistance experienced by the current generator in supplying an external electrical load. Knowing the current generating characteristics of the heterojunction and the electrode resistive characteristics of oxide layer 12, the user of the present invention can readily optimize the pattern of grid 14 for any given grid composition, i.e. solder, copper or the like. Likewise, numerous techniques exist in the art for depositing electrode 14 including vacuum deposition, electroless plating and electroplating, and similar techniques. A titanium layer may be interposed between grid electrode 14 and $Cu_xO$ layer 12 to serve as an adherence layer to physically bond the electrode 14 to the oxide 12.

In an alternate embodiment, a semi-transparent, electroconductive layer 13 may be substituted for, or used in conjunction with grid electrode 14. In a further embodiment, the uppermost surface region of copper oxide layer 12 is suitably doped to increase its electroconductivity to supplement or supplant the electroconductive grid 14 or the electroconductive layer 13. A back surface electrode 16 may contact the entire back surface of silicon substrate 10. Electrode 16 comprises a material used to form an ohmic contact to the silicon substrate 10 and provide a high conductivity current carrying electrode to complete the device. An adherence layer 17 comprising a layer of titanium may be interposed to insure physical bonding between the silicon and the electrode metal. As discussed with respect to grid electrode 14 numerous techniques are known in the art for depositing back surface electrode 16.

In a preferred embodiment, a relatively transparent anti-reflection coating 18 is deposited onto at least the exposed conducting layer. The anti-reflection coating, which matches the index refraction of the illumination surface to that of air minimizes the amount of light loss by reflection from the conducting surface caused by the abrupt change in refractive index between air and solar cell surface.

To assist one skilled in the art in the practice of the present invention, the following example details one specific embodiment of the invention.

EXAMPLE 1

A 500 Å layer of copper was vacuum deposited by thermal evaporation onto a Monsanto two inch diameter single crystal n-type silicon wafer having a polished surface (coating surface). The copper coated silicon wafer was then heated for about one minute on a hot plate in air at a temperature of about 300° C. During the heating, the physical appearance of the copper film changed from a reflective, metallic color to a deep blue translucent appearance, characteristic of the oxide film. A test probe comprising a point contact was used to contact the oxide. An open circuit voltage of 0.65 volts was obtained upon illumination. Low level light sensitivity was also evaluated; the device exhibiting substantial photo response at extremely low illumination levels. The specimen was replaced in the vacuum system to deposit a semi-transparent front (illumination) surface electrode comprising about 105 Å of silver. The back surface ohmic contact was also vacuum deposited, comprising 1000 Å of titanium followed by 5000 Å of silver.

After scribing and dividing the wafer into individual cells, the photovoltaic characteristics of the cell were obtained under AMIsolar simulation illumination. The cell exhibited a $J_{sc}$ of $\approx 9$ mA/cm$^2$; $V_{oc} \approx 0.445$ and a fill factor of about 0.48 resulting in a cell efficiency of about 1.9%.

What is claimed is:

1. A photovoltaic heterojunction device comprising a relatively thick substrate layer of n-type silicon having a major area surface; a relatively thin layer of copper deposited onto said silicon surface and subsequently oxidized to form a layer of $Cu_xO$ where x is an integer being 1 or 2, said $Cu_xO$ layer forming a heterojunction to said silicon, and means making ohmic contact to said silicon and $Cu_xO$ layers.

2. The heterojunction device of claim 1 wherein said silicon comprises n-type single crystal silicon.

3. The heterojunction device of claim 2 wherein said relatively thin layer of Cu ranges in thickness from about 30 Å to about 2000 Å.

4. The heterojunction device of claim 3 wherein said layer of Cu is about 500 Å in thickness.

5. A solar cell device comprising: a n-type silicon wafer having a major area surface a layer of $Cu_xO$ deposited onto said surface forming a heterojunction to said silicon; means making ohmic contact to said silicon and said $Cu_xO$ whereupon radiating said solar cell with an equivalent of air mass on sunlight said solar cell has a photovoltaic short circuit current of about 9mA/cm$^2$ and an open circuit voltage of about 0.445 volts.

6. The device of claim 1 or 5 wherein said ohmic contact to the $Cu_xO$ layer comprises a grid electrode.

7. The device of claim 6 wherein said grid electrode comprises an initial region of titanium contacting said oxide and functioning to physically bond an overlying metal layer thereto.

8. The device of claim 1 or 5 wherein said ohmic contact to the $Cu_xO$ layer comprises a semi-transparent layer of electro-conductive material.

9. The device of claim 1 or 5 wherein said ohmic contact to the silicon comprises a layer of titanium contacting said silicon and functioning to physically bond an overlying metal layer thereto.

10. A method of fabricating a photovoltaic heterojunction device, comprising the steps of:
    (a) depositing upon a substrate of n-type silicon a relatively thin layer of copper; and
    (b) subsequently oxidizing said copper layer to form an oxide of copper.

11. The method of claim 10, wherein said depositing step (a) comprises the step of thermally evaporating said copper in a vacuum.

12. The method of claim 10, wherein said oxidizing step (b) comprises the step of heating said silicon substrate in order to oxidize said deposited copper.

* * * * *

UNITED STATES PATENT AND TRADEMARK OFFICE
CERTIFICATE OF CORRECTION

PATENT NO. : 4,360,702
DATED : Nov. 23, 1982
INVENTOR(S) : Tom Feng and Amal K. Ghosh It is certified that error appears in the above—identified patent and that said Letters Patent is hereby corrected as shown below:

Column 1, line 12, change "oxide n-Silicon" to --oxide/n-Silicon--.

Column 1, line 16, change "copper, copper oxide" to --copper/copper oxide--.

Column 1, line 31, after "silicon" insert --silicon/--.

Column 2, line 7, after "film" insert --film.--.

Column 2, lines 7-8, delete "generally characterize the optical thickness sheet resistance of transmission properties.".

Column 2, line 14, change "13" to --12--.

Column 2, line 19, insert after "layer" to --layer to become--.

Column 2, line 24, delete "preferential".

Column 2, line 26, delete "preferential".

Column 2, line 50, change "an" to --a--.

Column 2, lines 58-59, change "electrode resistive" to --electric resistivity--.

Column 2, line 59, delete "characteristics".

Column 2, line 67, delete "physically bond the" insert in place thereof, --improve bonding between--

UNITED STATES PATENT AND TRADEMARK OFFICE
CERTIFICATE OF CORRECTION

PATENT NO. : 4,360,702

DATED : Nov. 23, 1982

INVENTOR(S) : Tom Feng and Amal K. Ghosh

It is certified that error appears in the above—identified patent and that said Letters Patent is hereby corrected as shown below:

Column 2, lines 67, after "electrode 14" insert --and copper--

Column 2, line 68, delete "to the"

Column 2, line 68, after "oxide" insert --layer--

Column 3, line 14, delete "insure physical" insert in place thereof, --improve--

Column 3, lines 21-22, delete "which matches the index refraction of the illumination surface to that of air"

Column 3, line 23, delete "conducting" insert thereof --front--

Column 3, line 23, after "surface" insert --surface.--

Column 3, lines 23,24,25, delete "caused by the abrupt change in refractive index between air and solar cell surface."

Column 3, line 41, change "volts" to --volt--

Column 3, line 43, change "exhibiting" to --exhibited--

Column 3, line 44, change "photo response" to --photo-response--

UNITED STATES PATENT AND TRADEMARK OFFICE
CERTIFICATE OF CORRECTION

PATENT NO. : 4,360,702

DATED : Nov. 23, 1982

Page 3 of 3

INVENTOR(S) : Tom Feng and Amal K. Ghosh

It is certified that error appears in the above—identified patent and that said Letters Patent is hereby corrected as shown below:

Column 3, line 52, change "AMIsolar" to --AMI solar--

Column 3, line 53, after "0.445" insert --V--

Column 4, line 20, after "surface" insert --;--

Column 4, line 23, change "radiating" to --irradiating--

Column 4, line 24, change "on" to --one--

Column 4, line 26, change "volts" to --volt--

Column 4, line 31, delete "physically"

Column 4, line line 38, delete "physically"

Signed and Sealed this

Fifth Day of July 1983

[SEAL]

Attest:

GERALD J. MOSSINGHOFF

Attesting Officer

Commissioner of Patents and Trademarks